(12) United States Patent
Kim et al.

(10) Patent No.: US 8,432,735 B2
(45) Date of Patent: *Apr. 30, 2013

(54) MEMORY SYSTEM AND RELATED METHOD OF PROGRAMMING

(75) Inventors: Yong June Kim, Seoul (KR); Jae hong Kim, Seoul (KR); Ki jun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 342 days.

This patent is subject to a terminal disclaimer.

(21) Appl. No.: 12/832,220

(22) Filed: Jul. 8, 2010

(65) Prior Publication Data

US 2011/0032759 A1    Feb. 10, 2011

(30) Foreign Application Priority Data

Aug. 7, 2009  (KR) .................. 10-2009-0072906

(51) Int. Cl.
*G11C 11/34* (2006.01)

(52) U.S. Cl.
USPC .................................... 365/185.03

(58) Field of Classification Search ............ 365/148
See application file for complete search history.

(56) References Cited

U.S. PATENT DOCUMENTS

| | | | |
|---|---|---|---|
| 7,436,733 B2 | 10/2008 | Mokhlesi | |
| 2004/0153621 A1* | 8/2004 | Polansky et al. | 711/202 |
| 2007/0168637 A1* | 7/2007 | Polansky et al. | 711/202 |
| 2007/0189073 A1 | 8/2007 | Aritome | |
| 2007/0206424 A1 | 9/2007 | Kuo et al. | |
| 2007/0206426 A1 | 9/2007 | Mokhlesi | |
| 2009/0027959 A1 | 1/2009 | Lee | |
| 2010/0223530 A1* | 9/2010 | Son et al. | 714/763 |

FOREIGN PATENT DOCUMENTS

| | | |
|---|---|---|
| JP | 09102747 A | 4/1997 |
| JP | 2000134101 A | 5/2000 |
| JP | 2005018439 A | 1/2005 |
| JP | 2007164899 A | 6/2007 |
| JP | 2008204528 A | 9/2008 |
| KR | 100329456 B1 | 3/2002 |
| KR | 1020040102106 A | 12/2004 |

* cited by examiner

*Primary Examiner* — Hoai V Ho
*Assistant Examiner* — Min Huang
(74) *Attorney, Agent, or Firm* — Volentine & Whitt, PLLC

(57) ABSTRACT

A method of programming a nonvolatile memory device comprises counting a number of state pairs in a unit of input data, modulating the unit of input data to reduce the number of state pairs contained therein, and programming the modulated unit of input data in the nonvolatile memory device. Each state pair comprises data with a first state and designated for programming in a memory cell connected to a first word line, and data with a second state and designated for programming in a memory cell connected to a second word line adjacent to the first word line. The memory cell connected to the first word line is adjacent to the memory cell connected to the second word line.

15 Claims, 14 Drawing Sheets

MEMORY SYSTEM AND RELATED METHOD OF PROGRAMMING

CROSS-REFERENCE TO RELATED APPLICATIONS

This application claims priority under 35 U.S.C. §119 to Korean Patent Application No. 10-2009-0072906 filed on Aug. 7, 2009, the disclosure of which is hereby incorporated by reference in its entirety.

BACKGROUND

Embodiments of the inventive concept relate generally to memory systems. More particularly, embodiments of the inventive concept relate to memory systems and related methods of programming.

Semiconductor memory devices are a common component of most modern electronic devices. They are included in a wide variety of devices ranging from satellite technologies to consumer electronics, and they are used to store both functional data such as code and application software, as well as nonfunctional data such as collected information. Because of the role that semiconductor memory devices play in modern electronic devices, improvements in memory performance can help to improve the overall performance of a wide variety of devices.

Semiconductor memory devices can be roughly classified as volatile semiconductor memory devices and nonvolatile semiconductor memory devices depending on whether they retain stored data when disconnected from power. In particular, nonvolatile semiconductor memory devices retain stored data when disconnected from power and volatile memory devices lose stored data when disconnected from power.

Flash memory is an increasingly common form of nonvolatile memory device. Due to a number of favorable characteristics such as high integration density and an ability to withstand physical shock, flash memory is now being used in a wide variety of electronic devices across the consumer and industrial spectra.

SUMMARY

Embodiments of the inventive concept provide a memory system and related programming method capable of reducing adverse coupling effects between adjacent memory cells.

According to one embodiment of the inventive concept, a method of programming a nonvolatile memory device comprises counting a number of state pairs in a unit of input data, modulating the unit of input data to reduce the number of state pairs contained therein, and programming the modulated unit of input data in the nonvolatile memory device. Each state pair comprises data with a first state and designated for programming in a memory cell connected to a first word line, and data with a second state and designated for programming in a memory cell connected to a second word line adjacent to the first word line. The memory cell connected to the first word line is adjacent to the memory cell connected to the second word line.

In certain embodiments, the memory cell connected to the first word line and the memory cell connected to the second word line are both connected to a common bit line.

In certain embodiments, the first state is an erase state and the second state is a top program state. In certain embodiments, where the counted number of state pairs is zero, the unit of input data is programmed in the nonvolatile memory device without modulation. In certain embodiments, modulating the unit of input data comprises executing a cyclic shift operation. In certain embodiments, modulating the unit of input data comprises executing a flipping operation.

In certain embodiments, the method further comprises repeatedly modulating the unit of input data until the number of state pairs in the modulated unit of input data is zero.

In certain embodiments, the method further comprises counting the number of state pairs in the modulated unit of input data, and programming the modulated unit of input data in the nonvolatile memory device upon determining that the number of state pairs in the modulated unit of input data is lower than a predetermined value. In certain embodiments, the predetermined value is at least two.

In certain embodiments, the nonvolatile memory device is a flash memory device, and in certain embodiments, the nonvolatile memory device is a two bits/cell flash memory device. In certain embodiments, the method further comprises simultaneously programming modulation related information in the nonvolatile memory device together with the modulated input data.

According to another embodiment of the inventive concept, a method of programming a nonvolatile memory device comprises modulating a unit of input data by random rearrangement based on a first seed value to generate a first modulated unit of input data, modulating the unit of input data by random rearrangement based on a second seed value to generate a second modulated unit of input data, and counting a number of state pairs in the first modulated unit of input data and counting a number of state pairs in the second modulated unit of input data. The method further comprises programming the first or second modulated unit of input data having the smallest number of state pairs in the nonvolatile memory device. Each state pair comprises data with a first state and designated for programming in a memory cell connected to a first word line, and data with a second state and designated for programming in a memory cell connected to a second word line adjacent to the first word line, wherein the memory cell connected to the first word line is adjacent to the memory cell connected to the second word line.

In certain embodiments, the memory cell connected to the first word line and the memory cell connected to the second word line are both connected to a common bit line.

According to still another embodiment of the inventive concept, a memory system comprises a nonvolatile memory device comprising a plurality of memory cells arranged in rows connected to corresponding word lines and columns connected to corresponding bit lines, and a memory controller controlling the nonvolatile memory device. The memory controller counts a number of state pairs in a unit of input data, modulates the input data to reduce the number of state pairs, and programs the modulated unit of input data in the nonvolatile memory device. Each state pair comprises data with a first state and designated for programming in a memory cell connected to a first word line, and data with a second state and designated for programming in a memory cell connected to a second word line adjacent to the first word line, wherein the memory cell connected to the first word line is adjacent to the memory cell connected to the second word line.

BRIEF DESCRIPTION OF THE DRAWINGS

Embodiments of the inventive concept are described below with reference to the accompanying drawings. In the drawings, like reference numbers denote like features.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

Selected embodiments of the inventive concept provide memory systems capable of reducing adverse coupling effects between adjacent memory cells. In general, adjacent memory cells having certain pairs of states can cause mutual interference. For instance, one type of interference is illustrated by the following example in a flash memory device.

In a flash memory device, data is stored in a memory cell by placing charge on its floating gate to change its threshold voltage. The data can then be read by detecting the memory cell's threshold voltage. Coupling effects between adjacent cells, such as capacitative coupling between the cells' respective floating gates, can cause one or both of the cells to have a modified threshold voltage. For instance, if one memory cell stores a large amount of charge on its floating gate, it may create an electrical field elevating the threshold voltage of an adjacent cell. Accordingly, the adjacent memory cell may produce an erroneous result in a read operation.

Pairs of data bits with states that may cause mutual or unilateral interference when programmed in memory cells located adjacent to each other along a Y-axis (a bitline direction) of a memory array are called "Y-state pairs". In general, the states that form Y-state pairs may be defined by a device designer based on specific device characteristics. However, for illustration purposes, it will be assumed that a Y-state pair is formed in a multi-level cell (MLC) flash device by data with a state corresponding to a highest threshold voltage (e.g., a state P3, or high program state) and data with a state corresponding to a lowest threshold voltage (e.g., a state "E", or erased state). In other words, in this example, a pair of data values corresponding to state P3 and state E form a Y-state pair.

In selected embodiments of the inventive concept, input data received by a memory system may contain Y-state pairs. That is, it may contain data that, if programmed within adjacent memory cells, might cause interference. Upon receiving input data containing Y-state pairs, the memory system may rearrange or alter the data in some way to remove the Y-state pairs. Such operations for rearranging or otherwise altering the data are referred to as modulation, and data that has been changed by modulation is referred to as modulation data.

Figure 1:
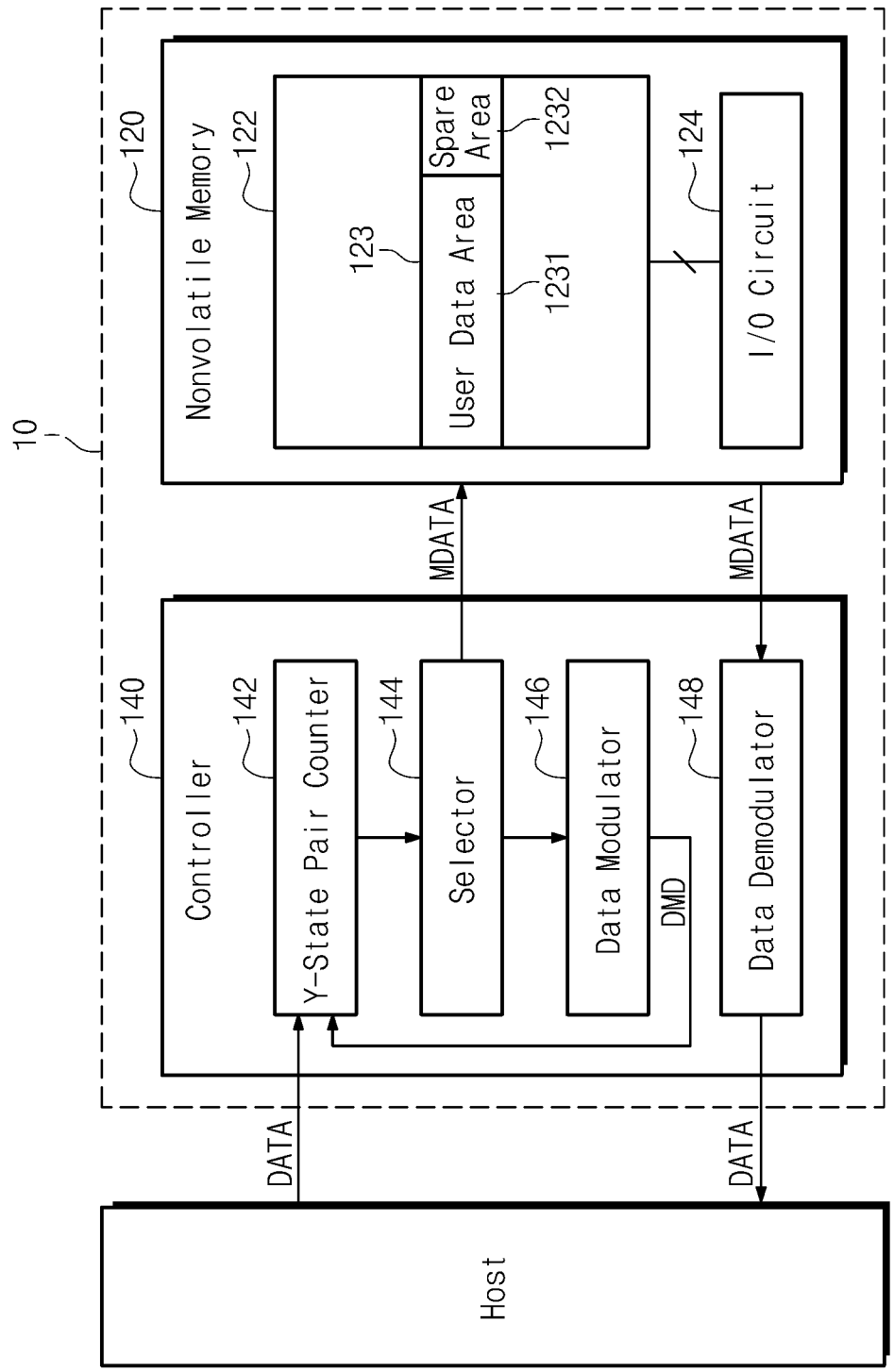
FIG. 1 is a block diagram of a memory system according to an embodiment of the inventive concept.

FIG. 1 is a block diagram of a memory system 10 according to an embodiment of the inventive concept. Referring to FIG. 1, memory system 10 comprises a nonvolatile memory device 120 and a memory controller 140.

Nonvolatile memory device 120 stores modulation data MDATA that has been received from memory controller 140 during a program operation, and outputs stored modulation data MDATA to memory controller 140 during read operations.

Nonvolatile memory device 120 comprises a memory cell array 122 and an input/output circuit 124. Memory cell array 122 stores data in a plurality of pages. In FIG. 1, only one page 123 is illustrated. Page 123 comprises a user data area 1231 and a spare area 1232. User data area 1231 stores modulation data MDATA, and spare area 1232 stores information related to the modulation of input data DATA.

Input/output circuit 124 temporarily stores received modulation data MDATA and programs the data in a page of memory cell array 122 during a program operation. Input/output circuit 124 also temporarily stores modulation data MDATA read from a page of memory cell array 122 during a read operation.

For explanation purposes, it will be assumed that nonvolatile memory device 120 is a NAND flash memory device. However, nonvolatile memory device 120 is not limited to these types of devices. For instance, in alternative embodiments, nonvolatile memory device 120 may comprise a NOR flash memory device, a resistive random access memory (RRAM), a phase-change random access memory (PRAM), a magnetroresistive random access memory (MRAM), a ferroelectric random access memory (FRAM), or a spin transfer torque random access memory (STT-RAM). Additionally, nonvolatile memory device 120 may be formed with a three-dimensional array structure.

Memory controller 140 controls read and program operations of nonvolatile memory device 120 in response to read and program requests from a host. Here, the host may be a personal computer, a laptop computer, a cellular phone, a personal digital assistant (PDA), a digital camera, a camcorder, a portable audio player, or any of several other types of host devices incorporating a nonvolatile memory device.

Memory controller 140 comprises a Y-state pair counter 142, a selector 144, a data modulator 146, and a data demodulator 148. Here, Y-state pair counter 142, selector 144, data modulator 146, and data demodulator 148 may be implemented as hardware or software such as firmware.

Y-state pair counter 142 counts a number of Y-state pairs in input data DATA received from the host, or modulation data DMD received from data modulator 146. Here, it is assumed that input data DATA and modulation data DMD comprise data to be programmed in rows and columns of memory cell array 120. In other words, input data DATA and modulation data DMD comprise data to be programmed into at least two pages.

Selector 144 selects modulation data MDATA to be programmed in nonvolatile memory device 120 according to the number of Y-state pairs counted by Y-state pair counter 142. Selector 144 selects modulation data MDATA as either input data DATA or modulation data DMD data, depending on which data contains a smaller number of Y-state pairs.

For example, where input data DATA or modulation data DMD has zero Y-state pairs, selector 144 selects the one with zero Y-state pairs as modulation data MDATA to be programmed in nonvolatile memory device 120. Where neither input data DATA nor modulation data DMD has zero Y-state pairs, selector 144 selects the data with the smallest number of Y-state pairs as modulation data MDATA. Where neither input data DATA nor modulation data DMD has an acceptably low number of Y-data pairs, memory controller 140 repeatedly modulates modulation data DMD until the number of Y-state pairs reaches an acceptable level as defined, for instance, by a predetermined threshold value.

Data modulator 146 performs modulation operations on input data DATA and modulation data DMD under the control of selector 144. Where selector 144 does not select modulation data MDATA to be programmed, data modulator 146 performs a modulation operation on input data DATA or modulation data DMD to generate new modulation data DMD.

The modulation operation can use any of several methods to modify data, such as cyclic shifting, bit flipping, etc. Modulation data DMD generated during a modulation operation further comprises information related to the modulation operation, such as the manner of modulation, e.g., so that the original input data can be subsequently recovered. The information related to the modulation operation is stored in spare area 1232 of each page 123. The generated modulation data DMD is delivered to Y-state pair counter 142, which counts the number of Y-state pairs.

The number of modulation operations performed by data modulator 146 is typically limited to a predetermined value. Additionally, the modulation operation is typically performed on a data having a predetermined size or unit, such as a byte, a sector, or a page. In the description that follows, the predetermined unit of data used in a modulation operation is called a subdata unit.

Data demodulator 148 demodulates modulation data MDATA read from nonvolatile memory device 120 to produce original data DATA. The demodulation operation is performed using the information related to the modulation operation stored in spare area 1232.

As indicated above, memory system 10 is designed to reduce a number of Y-state pairs programmed in nonvolatile memory device 120. Accordingly, memory system 10 can reduce adverse coupling effects between adjacent memory cells, such as electrical interference between memory cells programmed to erase and high program states. In general, the inventive concept is not limited to Y-state pairs having specific program states. Rather, the inventive concept can be applied to other types of state pairs, such as states of memory cells that are adjacent in directions other than the Y-direction, or states other than the P3 and E states mentioned above.

Figure 2:
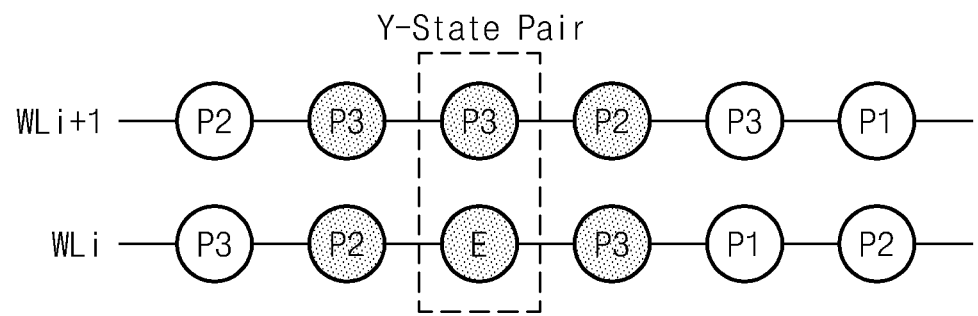
FIG. 2 is a diagram illustrating a Y-state pair according to an embodiment of the inventive concept.

FIG. 2 is a diagram illustrating a Y-state pair according to an embodiment of the inventive concept. Referring to FIG. 2, data to be programmed in a memory cell connected to an $i^{th}$ word line WLi has erase state E, and data to be programmed in a memory cell connected to an $i+1^{th}$ word line WLi+1 has a top state or high program state P3. The term "top program state" here refers to an upper program state among a set of program states, such as a state of a flash memory cell having an upper threshold voltage level. The memory cell to be programmed with erase state E and the memory cell to be programmed with high program state P3 are adjacent to each other along the Y direction (i.e., a bit line).

In FIG. 2, memory cells connected to the $i^{th}$ wordline constitute a first page of memory cells for storing a first page of data, and memory cells connected to the $i+1^{th}$ wordline constitute a second page of memory cells for storing a second page of data. The memory cells in the first and second pages store data with states selected from erase state E, and first through third program states P1 through P3, where the third state P3 is the high program state, first state P1 is a low program state, and second state P2 is a middle program state. In other embodiments, the memory cells may have more or fewer states, but no fewer than two possible states.

In the Y-state pair of FIG. 2, the memory cell connected to the $i^{th}$ word line WLi is in erase state E, and the memory cell connected to the $i+1^{th}$ word line WLi+1 is in high program state P3. Y-state pairs, however, can take different forms and include different pairs of states in other embodiments.

Figure 3:
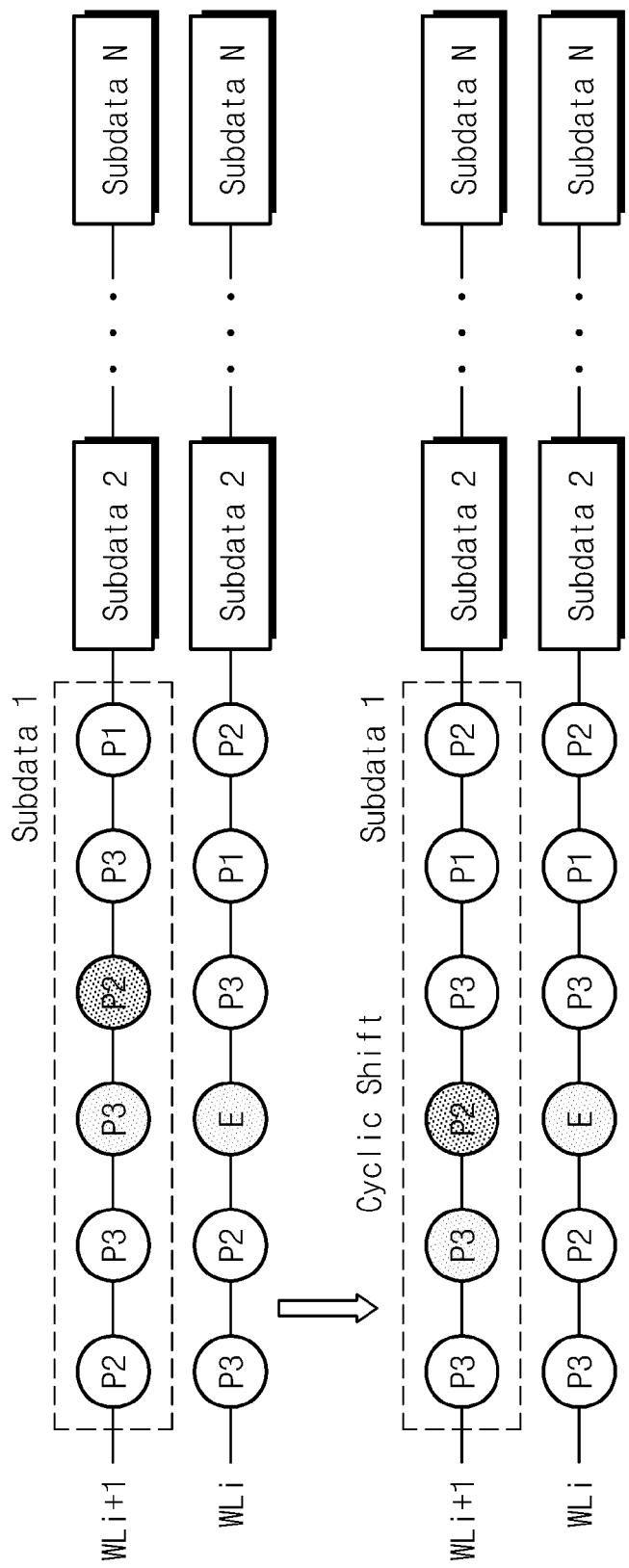
FIG. 3 is a diagram illustrating a modulation operation performed by a data modulator of FIG. 1.

FIG. 3 is a diagram illustrating a modulation operation performed by data modulator 146 of FIG. 1 according to an embodiment of the inventive concept. In the embodiment of FIG. 3, the modulation operation performed by data modulator 146 uses a cyclic shift method. For explanation purposes, it is assumed that data to be programmed in each page is divided into subdata 1 through subdata N, where N is a natural number. Data modulator 146 performs a modulation operation on a subdata unit. For explanation purposes, each subdata unit in FIG. 3 corresponds to six data states or six memory cells. The inventive concept, however, is not limited to the illustrated subdata size.

Referring to FIG. 3, the cyclic shift moves subdata (to be programmed in memory cells connected to the $i+1^{th}$ word line WLi+1) to the left. For instance, first subdata subdata 1 with the state sequence P2-P3-P3-P2-P3-P1 is shifted and becomes first subdata 1 with the state sequence P3-P3-P2-P3-P1-P2.

In addition, Y-state pair counter 142 counts the number of Y-state pairs (e.g., E-P3 pairs) from first subdata subdata 1 to be programmed in memory cells connected to the ith word line WLi and the modulated first subdata subdata 1 to be programmed in memory cells connected to $i+1^{th}$ word line WLi+1. As a modulation operation result, as shown in FIG. 3, the number of Y-state pairs of first subdata subdata 1 becomes 0. Accordingly, selector 144 selects modulation data to be programmed in memory cells connected to the $i+1^{th}$ word line WLi+1. At this point, information related to the modulation operation (i.e., a cyclic shift value) becomes 1. The cyclic shift value indicates a number of shifts.

Figure 4:
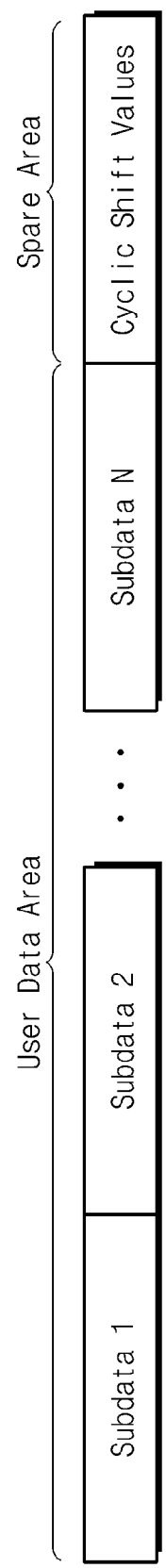
FIG. 4 is a diagram illustrating a page of data to be stored during the modulation operation of FIG. 3.

In addition, the above-mentioned modulation operation is performed on each of the remaining subdata 2 through subdata N. As a result, as shown in FIG. 4, the number "N" of modulated subdata is stored in a user data area and cyclic shift values of each modulated subdata are stored in a spare area.

Figure 5:
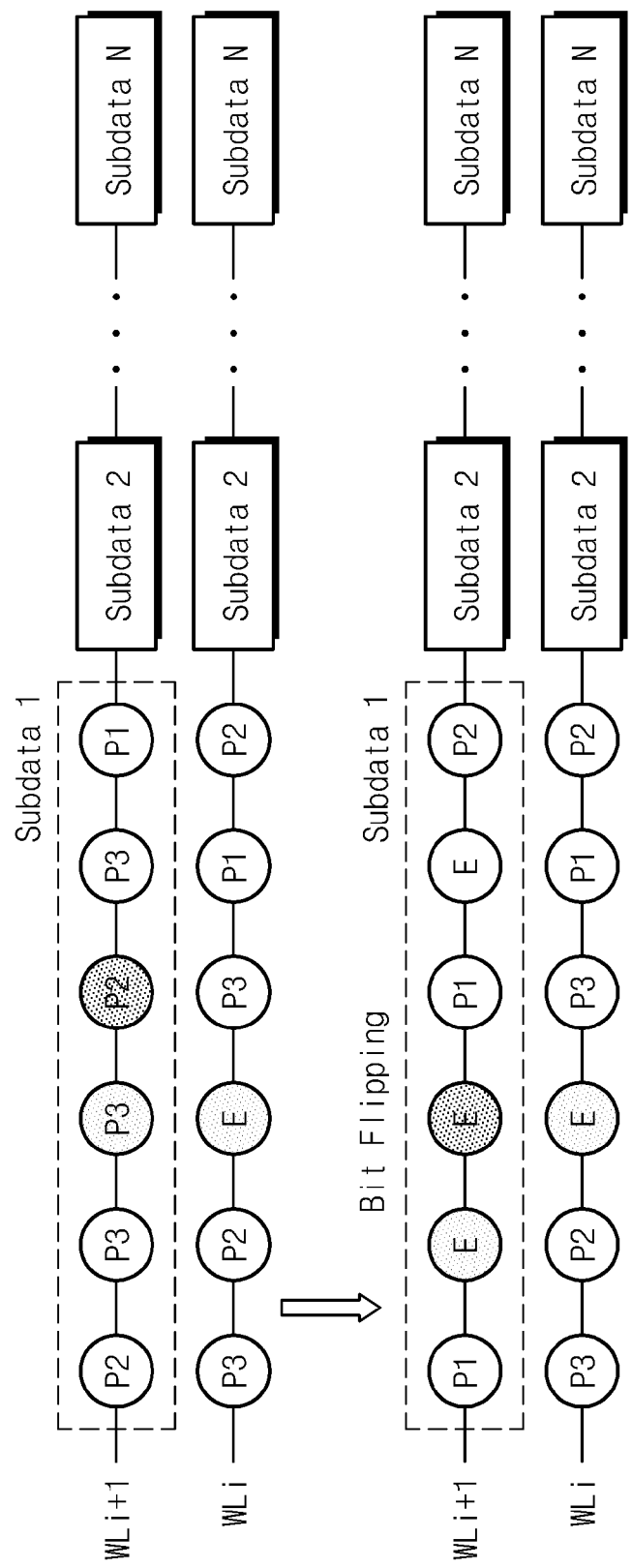
FIG. 5 is a diagram illustrating a modulation operation performed by the data modulator of FIG. 1 according to another embodiment of the inventive concept.

FIG. 5 is a diagram illustrating a modulation operation performed by the data modulator of FIG. 1 according to another embodiment of the inventive concept. Referring to FIG. 5, the modulation operation performed by data modulator 146 uses a flipping method. For explanation purposes, it is assumed that data to be programmed in each page is divided into subdata 1 through subdata N, where N is a natural number. Data modulator 146 performs a modulation operation by a subdata unit.

Referring to FIG. 5, the flipping reverses a state of subdata to be programmed in memory cells connected to the $i+1^{th}$ word line WLi+1. For example, first subdata subdata 1 with the state sequence P2-P3-P3-P2-P3-P1 flips and becomes first subdata subdata 1 with the state sequence P1-E-E-P1-E-P2.

In addition, Y-state pair counter 142 counts the number of Y-state pairs (e.g., E-P3 pairs) using first subdata subdata 1 to be programmed in memory cells connected to the $i^{th}$ word line WLi and the modulated first subdata to be programmed in memory cells connected to the $i+1^{th}$ word line WLi+1. As a modulation operation result, as shown in FIG. 5, the number of Y-state pairs of first subdata subdata 1 becomes 0. Accordingly, selector 144 selects modulation data to be programmed in memory cells connected to the $i+1^{th}$ word line WLi+1. At this point, information related to the modulation operation (i.e., a flipping value) becomes 1. Here, the flipping value is the number of flips.

Figure 6:
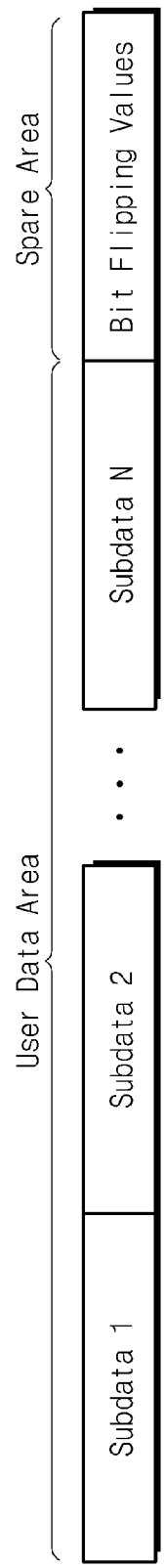
FIG. 6 is a diagram illustrating a page of data to be stored during the modulation operation of FIG. 5.

The modulation operation of FIG. 5 is performed on each of the remaining subdata units subdata 2 through subdata N. As a result, as shown in FIG. 6, the number "N" of modulated subdata is stored in a user data area and flipping values of each modulated subdata are stored in a spare area.

Figure 7:
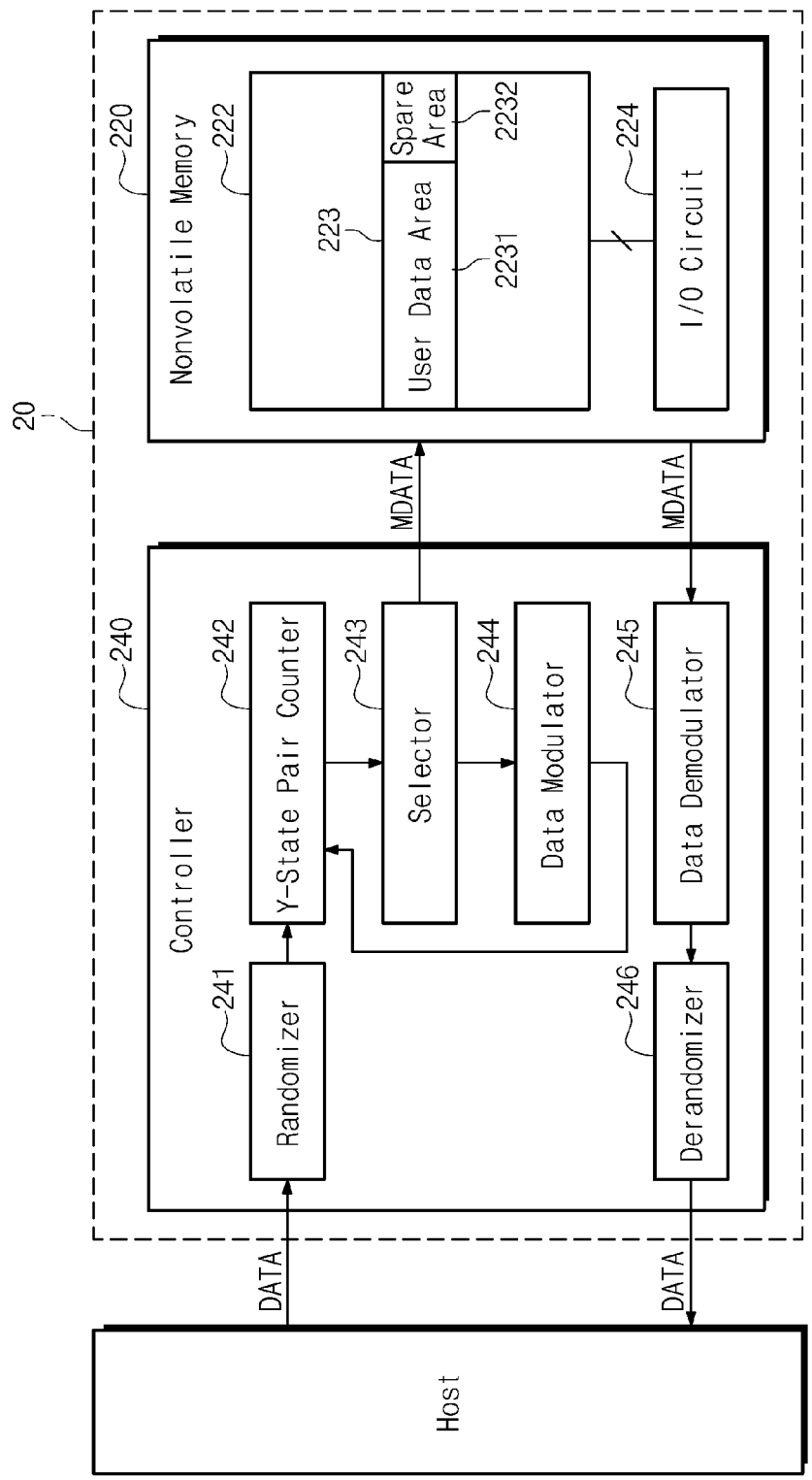
FIG. 7 is a block diagram illustrating a memory system according to another embodiment of the inventive concept.

FIG. 7 is a block diagram illustrating a memory system 20 according to another embodiment of the inventive concept. Referring to FIG. 7, memory system 20 comprises a nonvolatile memory device 220 and a memory controller 240.

Nonvolatile memory device 220 is substantially identical to nonvolatile memory device 120 of FIG. 1.

Memory controller 240 is similar to memory controller 140 of FIG. 1, with a Y-state pair counter 242, a selector 243, a data modulator 244, and a data demodulator 245 being formed similar to Y-state pair counter 142, selector 144, data modulator 146, and data demodulator 148 of FIG. 1, respectively. In addition, memory controller 240 further comprises a randomizer 241 and a derandomizer 246. Randomizer 241 modulates data DATA received from a host into random data based on a seed value. The seed value may comprise, for instance, an input address. In some embodiments, the random data allows states of data in a page to be programmed to be uniformly distributed. For example, where nonvolatile memory device 220 is a 2-bit multi level cell NAND flash memory device, erase states E, P1, P2, and P3 can be uniformly distributed in each page. In other embodiments, non-uniform random distributions can also be used.

Derandomizer 246 demodulates data delivered from data modulator 245 into original data DATA using a seed value in response to a read request of a host and then outputs original data DATA.

Figure 8:
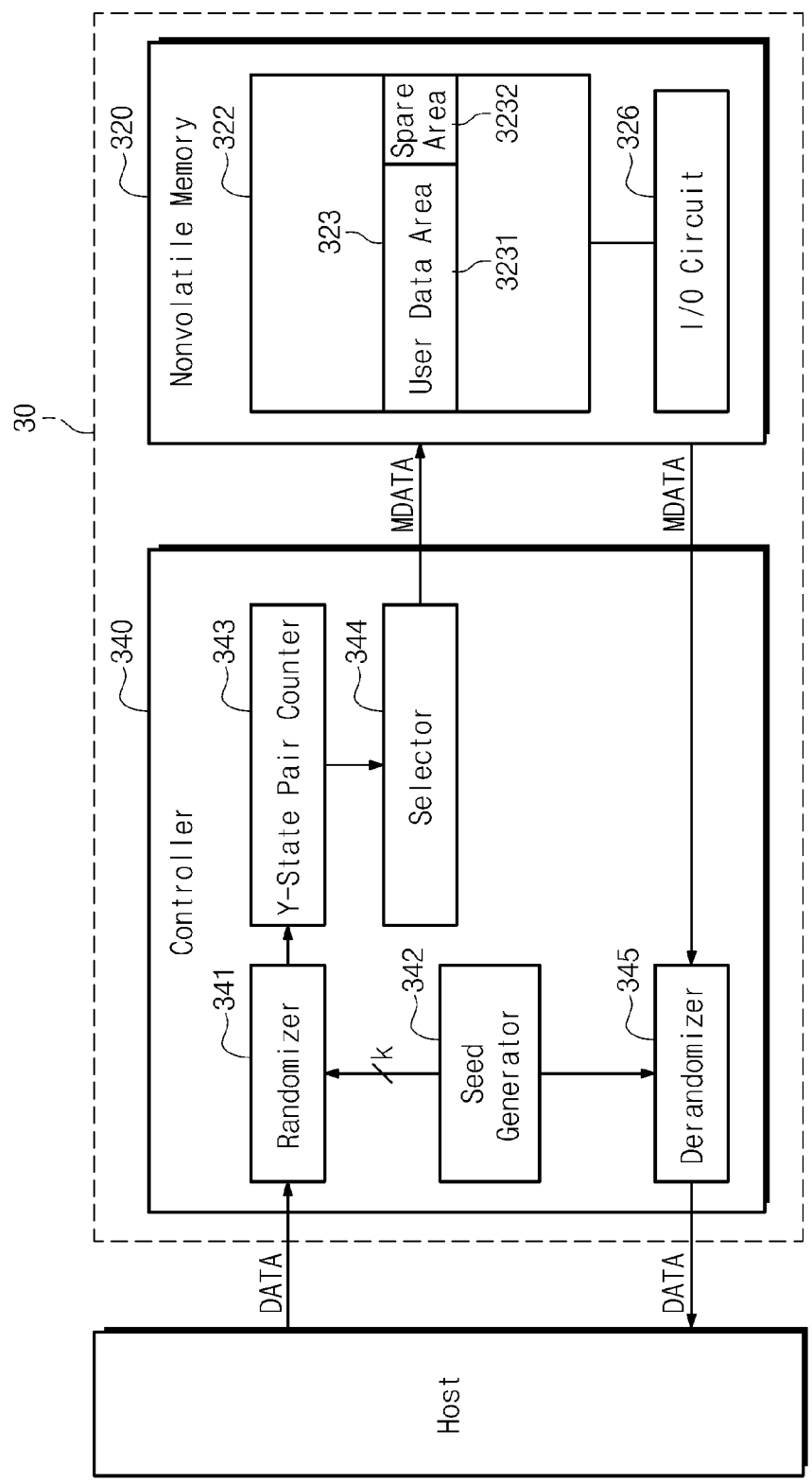
FIG. 8 is a block diagram illustrating a memory system according to still another embodiment of the inventive concept.

FIG. 8 is a block diagram illustrating a memory system 30 according to another embodiment of the inventive concept. Referring to FIG. 8, memory system 30 comprises a nonvolatile memory device 320 and a memory controller 340.

Nonvolatile memory device 320 is substantially identical to nonvolatile memory device 120 of FIG. 1.

Memory controller 340 comprises a randomizer 341, a seed generator 342, a Y-state pair counter 343, a selector 344, and a derandomizer 345.

Randomizer 341 randomizes a predetermined number of elements of data DATA using a seed value generated by seed generator 342. For instance, in one embodiment, randomizer 341 randomizes K (K>2) pairs from data DATA to generate a random sequence of length K. Y-state pair counter 343 counts the number of Y-state pairs in the random sequence generated by randomizer 341.

Selector 344 selects random data having a smallest Y-state pair count as calculated by Y-state pair counter 343, as modulation data MDATA to be programmed in nonvolatile memory 320. The seed value corresponding to the selected modulation data MDATA is stored in a page where modulation data MDATA is to be programmed and can be used to derandomize the data in a read operation. The seed value can be stored, for instance, in a spare area of a page to be programmed.

Derandomizer 345 reads modulation data MDATA from a corresponding page in response to a read request from a host, and demodulates the read modulation data MDATA into original data DATA using the seed value information stored in nonvolatile memory 340. The demodulated data DATA is then output to the host.

Figure 9:
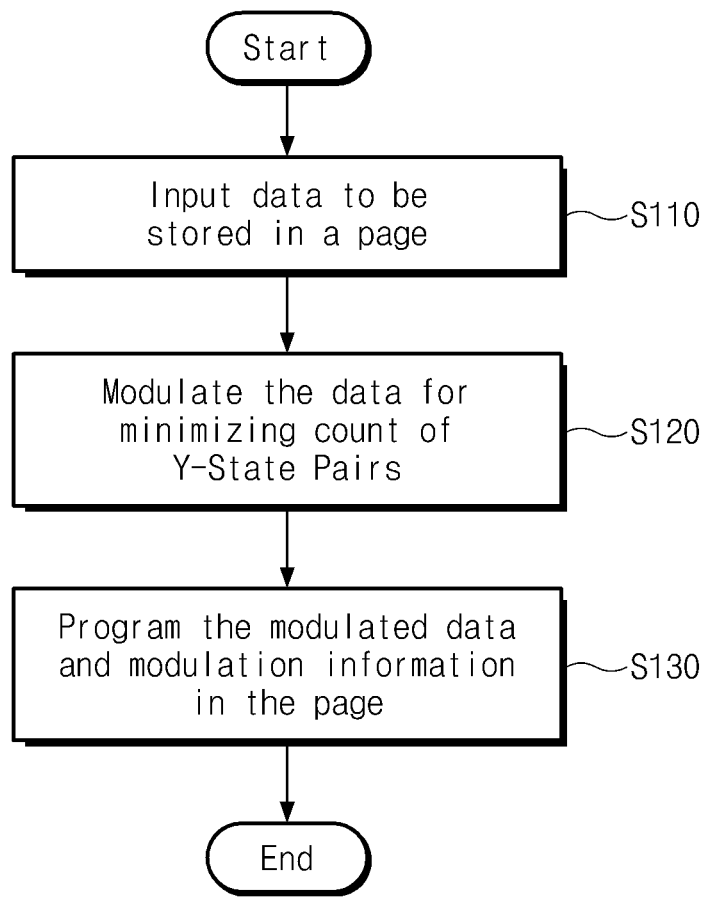
FIG. 9 is a diagram illustrating a method of programming a nonvolatile memory device according to an embodiment of the inventive concept.

FIG. 9 is a diagram illustrating a programming method of a nonvolatile memory device according to an embodiment of the inventive concept. In the description that follows, example method steps will be denoted by parentheses (SXXX).

In the method of FIG. 9, a memory system receives data to be stored in a page of the nonvolatile memory device (S110). Next, the received data is modulated to minimize a number of Y-state pairs in the data (S120). Then, the modulation data and modulation related information are programmed in a page of the nonvolatile memory device (S130).

In selected embodiments described in relation to FIGS. 1 through 9, a memory system modulates data to reduce the number of Y-state pairs in the data, and programs resulting modulation data in a nonvolatile memory device during a program operation. As indicated above, the inventive concept is not limited to reducing of the number of Y-state pairs. For instance, in alternative embodiments, a memory system could reduce the number of state pairs in a different direction, such as a diagonal direction.

Figure 10:
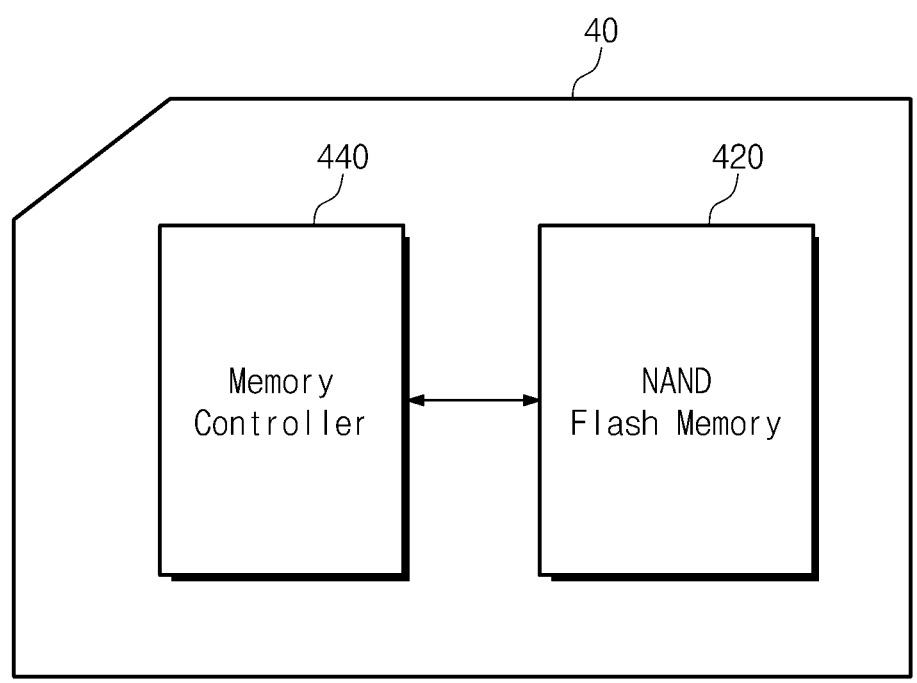
FIG. 10 is a block diagram of a memory card according to an embodiment of the inventive concept.

FIG. 10 is a block diagram of a memory card 40 according to an embodiment of the inventive concept. Referring to FIG. 10, memory card 40 comprises a NAND flash memory device 420 and a memory controller 440 for controlling the NAND flash memory device 420.

NAND flash memory device 420 is configured similar to nonvolatile memory device 120 of FIG. 1. Memory controller 440 is similar to one of memory controller 240 of FIG. 7 and memory controller 340 of FIG. 8. In memory card 40, memory controller 440 modulates input data to reduce the number of Y-state pairs and NAND flash memory device 420 program the modulation data.

In certain embodiments, memory card 40 comprises a multi media card (MMC), a security digital (SD) card, a miniSD card, a memory stick, a smart media card, or a Trans-Flash card.

Figure 11:
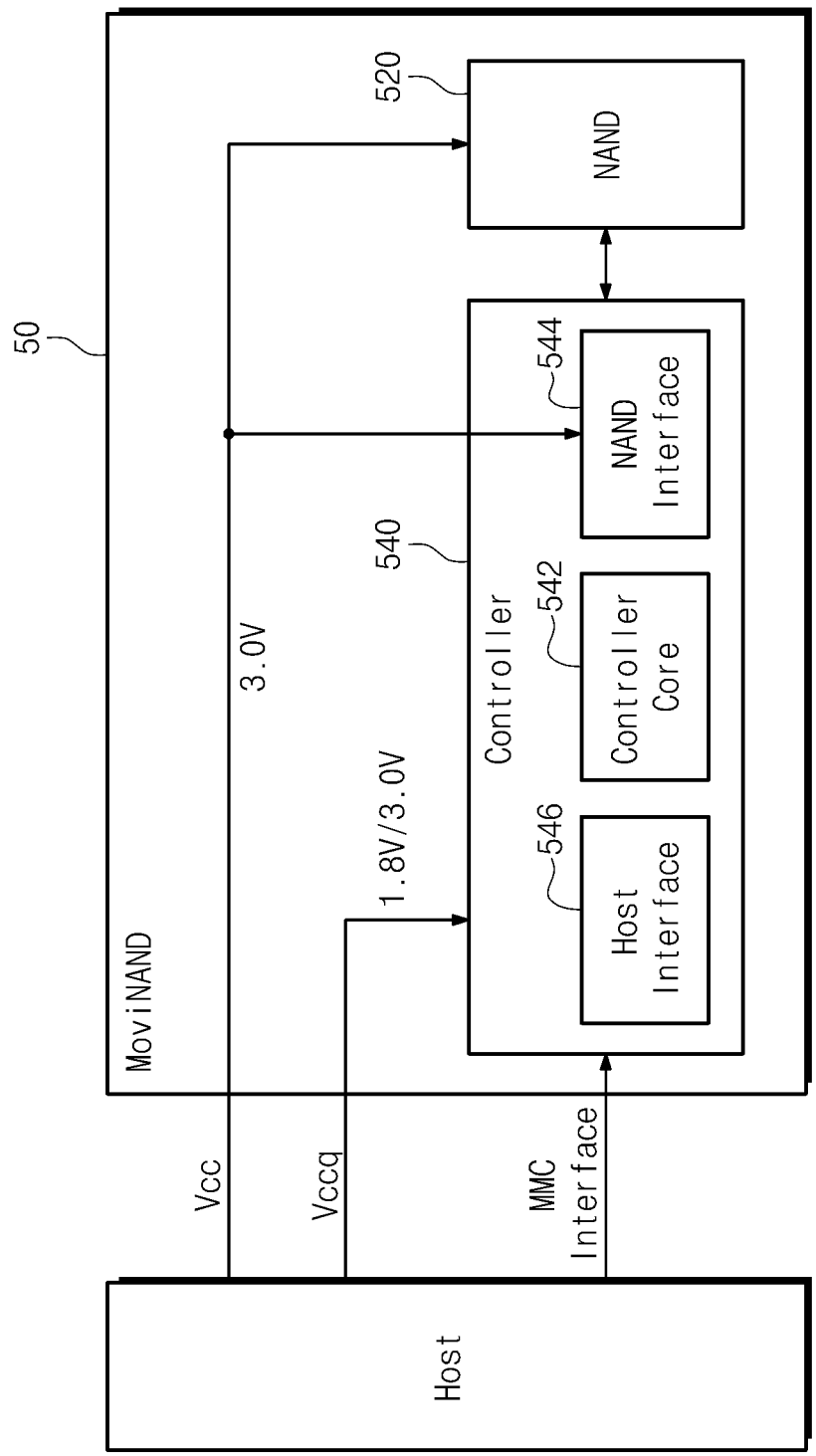
FIG. 11 is a block diagram illustrating a MoviNAND™ device according to an embodiment of the inventive concept.

FIG. 11 is a block diagram illustrating a MoviNAND 50 according to an embodiment of the inventive concept. Referring to FIG. 11, MoviNAND 50 comprises a NAND flash memory device 520 and a controller 540.

NAND flash memory device 520 is formed by stacking single NAND flash memories in one package (e.g., fine-pitch ball grid array (FBGA)). Here, each of the NAND flash memories is similar to nonvolatile memory device 120 of FIG. 1. Additionally, NAND flash memory 520 comprises a MLC flash memory device or a single level cell (SLC) flash memory device.

Controller 540 comprises a controller core 542, a NAND interface 544, and a host interface 546. Controller core 542 controls general operations of MoviNAND 50. Controller core 542 is realized identical to one of memory controllers 140, 240, and 340 of FIGS. 1, 7, and 8. NAND interface 544 provides an interface between the NAND flash memory device 520 and controller 540. Host interface 546 provides an interface between controller 540 and a Multi Media Card of the host.

In MoviNAND 50, controller core 542 modulates input data to reduce the number of Y-state pairs and the NAND flash memory device 520 programs the resulting modulation data.

MoviNAND 50 receives power voltages Vcc and Vccq from the host. Here, power voltage Vcc (e.g., 3.0 V) is supplied to NAND flash memory device 520 and NAND interface 540, and power voltage Vccq (e.g., 1.8 V/3 V) is supplied to controller 540.

Certain embodiments of the inventive concept can be implemented using an SSD, as illustrated, for instance, in FIGS. 12 through 15.

Figure 12:
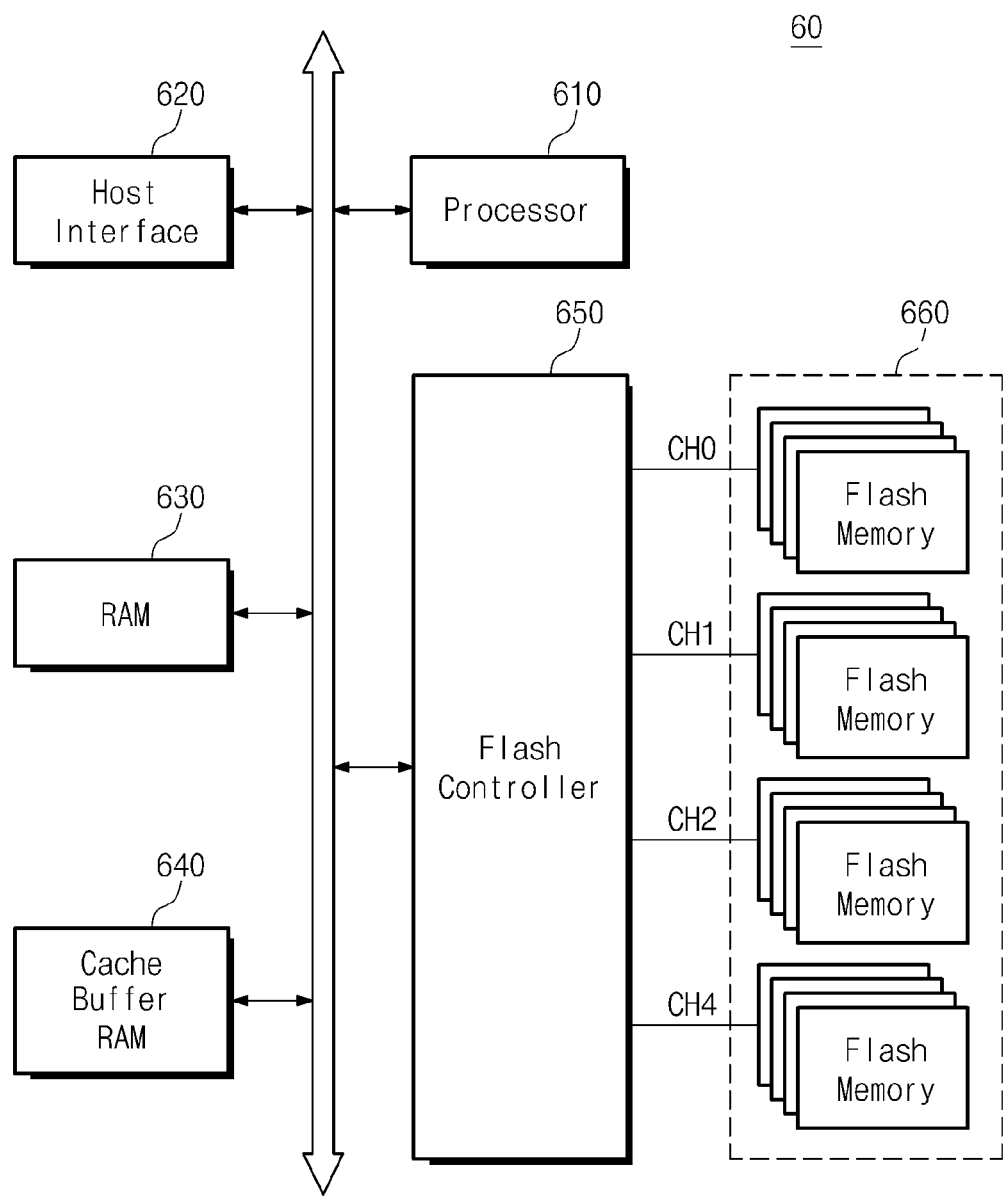
FIG. 12 is a block diagram illustrating a solid state drive (SSD) according to an embodiment of the inventive concept.

FIG. 12 is a block diagram illustrating an SSD according to an embodiment of the inventive concept. Referring to FIG. 12, SSD 60 comprises a processor 610, a host interface 620, a RAM 630, a cache buffer RAM 640, a flash controller 650, and a plurality of flash memory devices 660. Here, each of the flash memory devices is similar to nonvolatile memory device 120 of FIG. 1. Additionally, flash controller 650 is similar to one of memory controllers 140, 240, and 340 of FIGS. 1, 7 and 8. In SSD 60, flash controller 650 modulates input data to reduce the number of Y-state pairs and the plurality of flash memory devices 660 program the modulation data.

Host interface 620 exchanges data with a host under the control of processor 610. Host interface 620 fetches a command and an address from the host and delivers them to processor 610 through a central processing unit (CPU) bus. In certain embodiments, host interface 620 comprises one of a serial advanced technology attachment (SATA) interface, a parallel advanced technology attachment (PATA) interface, and an External SATA (ESATA) interface.

Data received from the host through host interface 620 or data to be transmitted to the host is delivered through cache buffer RAM 640 without passing through the CPU bus under the control of processor 610. RAM 630 is used to temporarily store data used for the operation of SSD 60. In certain embodiments, RAM 630 comprises DRAM and SRAM.

Cache buffer RAM 640 temporarily stores data transmitted between the host and flash memory devices 660. Additionally, cache buffer RAM 640 is used to store programs operated by processor 610. Cache buffer RAM 640 is regarded as one kind of a buffer memory and may be implemented with SRAM.

Flash controller 650 exchanges data with the flash memory devices 660 that are used as a storage device. Flash controller 650 is configured to support a NAND flash memory, an One-NAND flash memory, a multi level flash memory, and a single level flash memory.

Processor 610 and flash controller 650 may be implemented using a processor such as an ARM processor.

Figure 13:
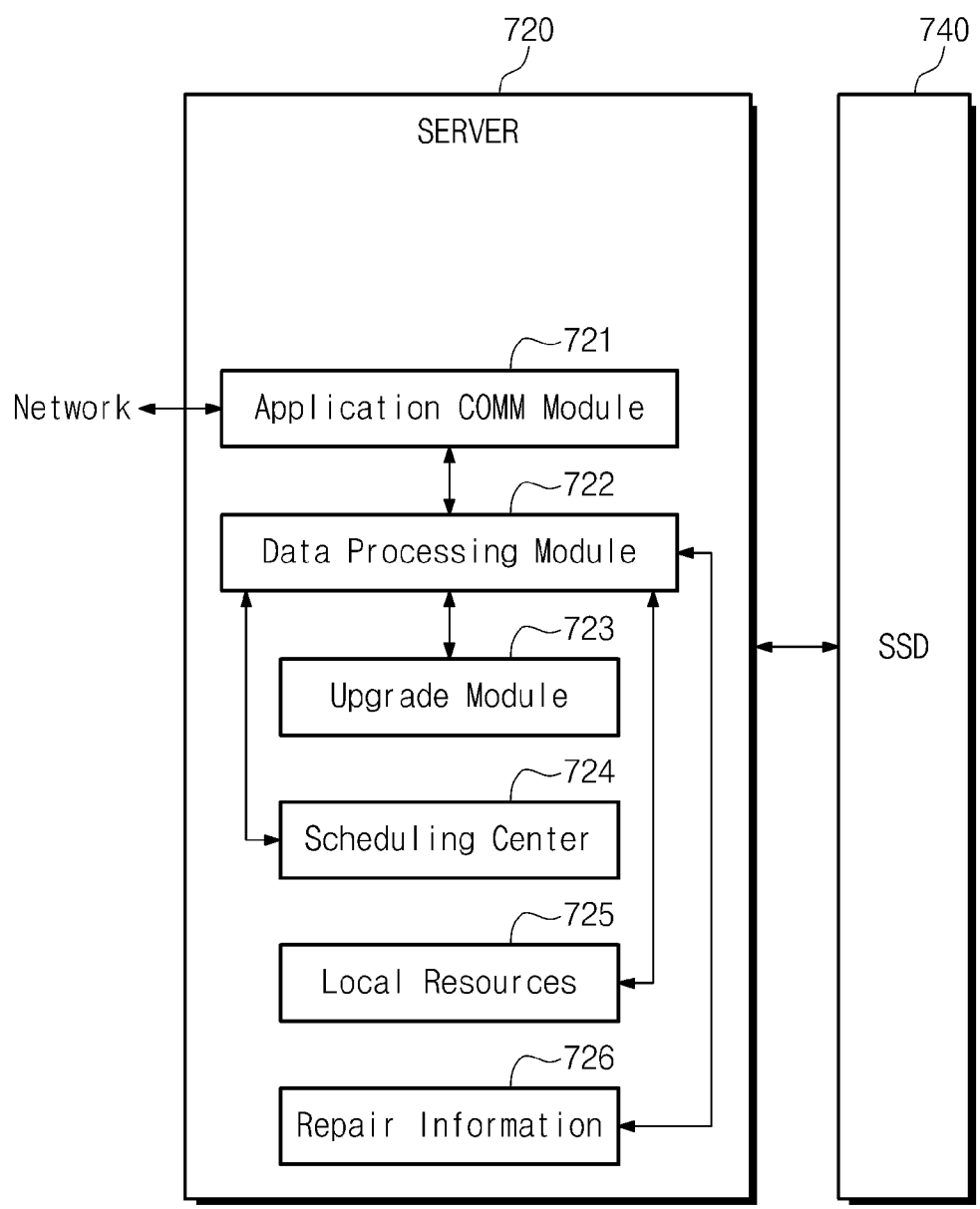
FIG. 13 is a block diagram illustrating a server system using a SSD according to an embodiment of the inventive concept.

FIG. 13 is a block diagram illustrating a server system using an SSD according to an embodiment of the inventive concept. Referring to FIG. 13, server system 70 comprises a server 720 and an SSD 740 for storing data used to operate server 720. SSD 740 is configured substantially identical to SSD 60 of FIG. 12.

Server 720 comprises an application communication module 721, a data processing module 722, an upgrade module 723, a scheduling center 724, a local resource module 725, and a repair information module 726.

Application communication module 721 is implemented to allow communication between server 720 and a computing system connected to a network or between server 720 and SSD 740. Application communication module 721 transmits data or information provided through the user interface to data processing module 722.

Data processing module 722 is linked to local resource module 725. Local resource module 725 provides a list of repair shops/dealers/technical information to a user based on data or information input to server 720.

Upgrade module 723 interfaces with data processing module 722 and upgrades firmware, reset code, diagnosis system upgrade, and other information in server 720 based on data or information transmitted from SSD 740. Scheduling center 724 allows a real-time option for a user based on data or information input to server 720.

Repair information module 726 interfaces with data processing module 722. Repair information module 726 provides repair related information (e.g., audio, video, or text files) to a user. Data processing module 722 packages the related information based on information delivered from SSD 740. Following packaging, the information may be transmitted to SSD 740 or displayed to a user.

Figure 14:
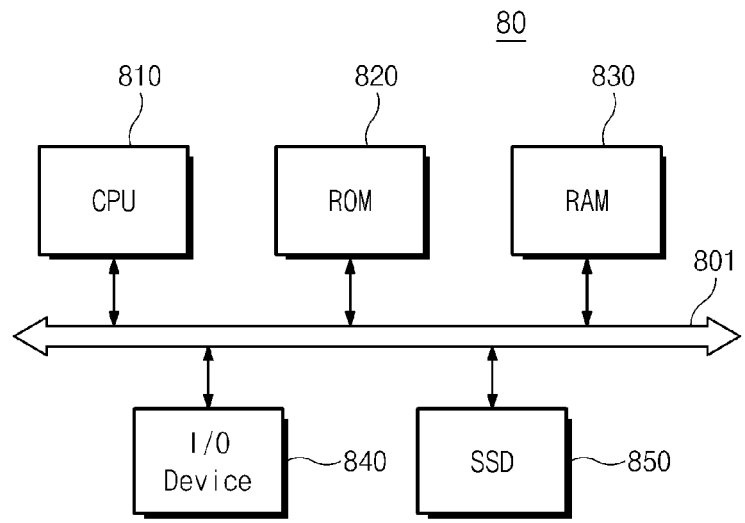
FIG. 14 is a block diagram illustrating a computing system according to an embodiment of the inventive concept.

FIG. 14 is a block diagram illustrating a computing system according to an embodiment of the inventive concept. Referring to FIG. 14, computing system 80 comprises a central processing unit (CPU) 810, a ROM 820, a RAM 830, an input/output device 840, and an SSD 850.

CPU 810 is connected to a system bus 801. ROM 820 stores data used for operating computing system 80. This data typically comprises a start command sequence or a basic input/output operation system (BIOS) sequence. RAM 830 temporarily store data generated when CPU 810 is executed.

Input/output device 840 is connected to the system bus 801 through an input/output device interface such as a keyboard, a pointing device (e.g., a mouse), a monitor, and a modem.

SSD 850 is a readable storage device and comprises similar elements as SSD 60 of FIG. 12.

Figure 15:
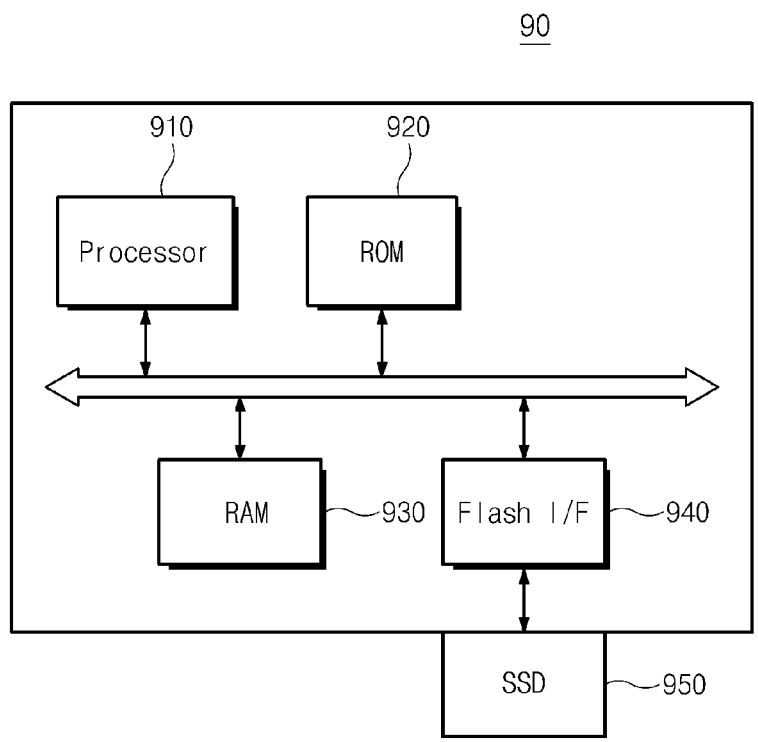
FIG. 15 is a block diagram illustrating an electronic device according to an embodiment of the inventive concept.

FIG. 15 is a block diagram illustrating an electronic device according to an embodiment of the inventive concept. Electronic device 90 comprises a processor 910, a ROM 920, a RAM 930, a flash interface 940, and an SSD 950.

Processor 910 accesses RAM 930 to execute firmware or other code. Processor 910 accesses ROM 920 to execute fixed command sequences such as a start command sequence or a basic input/output operation system sequence. Flash interface 940 acts as an interface between electronic device 90 and SSD 950.

SSD 950 is detachable from electronic device 90. SSD 950 comprises substantially the same components as SSD 60 of FIG. 12.

In certain embodiments, electronic device 90 comprises a cellular phone, a PDA, a digital camera, a camcorder, and a portable audio playing device (e.g., MP3), or a portable media player (PMP).

The memory systems and storage devices described above can be mounted in various forms of packages. For example, the memory system or the storage device is mounted using packages comprising package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP)

The memory systems and the programming method described above modulate data to be programmed such that the number of specific state pairs is reduced. Consequently, program operations involving specific state pairs are decreased to reduce coupling effects between adjacent memory cells.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of programming a nonvolatile memory device, comprising:
   counting a number of state pairs in a unit of input data, each state pair comprising data with a first state and designated for programming in a memory cell connected to a first word line, and data with a second state and designated for programming in a memory cell connected to a second word line adjacent to the first word line, wherein the memory cell connected to the first word line is adjacent to the memory cell connected to the second word line;
   modulating the unit of input data to reduce the number of state pairs contained therein; and
   programming the modulated unit of input data in the nonvolatile memory device.

2. The method of claim 1, wherein the memory cell connected to the first word line and the memory cell connected to the second word line are both connected to a common bit line.

3. The method of claim 1, wherein the first state is an erase state and the second state is a top program state.

4. The method of claim 1, wherein where the counted number of state pairs is zero, the unit of input data is programmed in the nonvolatile memory device without modulation.

5. The method of claim 1, wherein modulating the unit of input data comprises executing a cyclic shift operation.

6. The method of claim 1, wherein modulating the unit of input data comprises executing a flipping operation.

7. The method of claim 1, further comprising repeatedly modulating the unit of input data until the number of state pairs in the modulated unit of input data is zero.

8. The method of claim 1, further comprising counting the number of state pairs in the modulated unit of input data; and
   programming the modulated unit of input data in the nonvolatile memory device upon determining that the number of state pairs in the modulated unit of input data is lower than a predetermined value.

9. The method of claim 8, wherein the predetermined value is at least two.

10. The method of claim 1, wherein the nonvolatile memory device is a flash memory device.

11. The method of claim 10, wherein the nonvolatile memory device is a two bits/cell flash memory device.

12. The method of claim 1, further comprising simultaneously programming modulation related information in the nonvolatile memory device together with the modulated input data.

13. A method of programming a nonvolatile memory device, comprising:
    modulating a unit of input data by random rearrangement based on a first seed value to generate a first modulated unit of input data;
    modulating the unit of input data by random rearrangement based on a second seed value to generate a second modulated unit of input data;
    counting a number of state pairs in the first modulated unit of input data and counting a number of state pairs in the second modulated unit of input data; and
    programming the first or second modulated unit of input data having the smallest number of state pairs in the nonvolatile memory device;
    wherein each state pair comprises data with a first state and designated for programming in a memory cell connected to a first word line, and data with a second state and designated for programming in a memory cell connected to a second word line adjacent to the first word line, wherein the memory cell connected to the first word line is adjacent to the memory cell connected to the second word line.

14. The method of claim 13, wherein the memory cell connected to the first word line and the memory cell connected to the second word line are both connected to a common bit line.

15. A memory system, comprising:
    a nonvolatile memory device comprising a plurality of memory cells arranged in rows connected to corresponding word lines and columns connected to corresponding bit lines; and
    a memory controller controlling the nonvolatile memory device,
    wherein the memory controller counts a number of state pairs in a unit of input data, modulates the input data to reduce the number of state pairs, and programs the modulated unit of input data in the nonvolatile memory device, and wherein each state pair comprises data with a first state and designated for programming in a memory cell connected to a first word line, and data with a second state and designated for programming in a memory cell connected to a second word line adjacent to the first word line, wherein the memory cell connected to the first word line is adjacent to the memory cell connected to the second word line.

* * * * *